(12) United States Patent
Nikitin et al.

(10) Patent No.: US 10,411,184 B1
(45) Date of Patent: Sep. 10, 2019

(54) VERTICAL SPIN ORBIT TORQUE DEVICES

(71) Applicant: Samsung Electronics Co., LTD., Gyeonggi-do (KR)

(72) Inventors: Vladimir Nikitin, Campbell, CA (US); Dmytro Apalkov, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/968,514

(22) Filed: May 1, 2018

Related U.S. Application Data

(60) Provisional application No. 62/637,596, filed on Mar. 2, 2018.

(51) Int. Cl.
| | |
|---|---|
| *H01L 43/08* | (2006.01) |
| *H01L 27/22* | (2006.01) |
| *H01L 43/02* | (2006.01) |
| *G11C 11/16* | (2006.01) |
| *H01F 10/32* | (2006.01) |
| *H01L 43/12* | (2006.01) |

(52) U.S. Cl.
CPC ............ *H01L 43/08* (2013.01); *G11C 11/161* (2013.01); *G11C 11/1673* (2013.01); *G11C 11/1675* (2013.01); *H01F 10/329* (2013.01); *H01F 10/3254* (2013.01); *H01F 10/3286* (2013.01); *H01L 27/228* (2013.01); *H01L 43/02* (2013.01); *H01L 43/12* (2013.01); *H01F 10/3272* (2013.01)

(58) Field of Classification Search
CPC ....... H01L 43/08; H01L 27/228; H01L 43/02; H01L 43/12; G11C 11/161; G11C 11/1673; G11C 11/1675; H01F 10/3254; H01F 10/3286; H01F 10/329
See application file for complete search history.

(56) References Cited

U.S. PATENT DOCUMENTS

| | | | |
|---|---|---|---|
| 6,351,410 B1 | 2/2002 | Nakao | |
| 6,768,152 B2 * | 7/2004 | Higo ................... | B82Y 10/00 257/294 |
| 6,781,872 B2 | 8/2004 | Saito | |
| 6,977,401 B2 | 12/2005 | Hosotani | |
| 7,405,961 B2 | 7/2008 | Haratani | |
| 7,460,393 B2 | 12/2008 | Haratani | |
| 7,885,105 B2 | 2/2011 | Li | |
| 7,944,736 B2 * | 5/2011 | Dieny .................. | H01L 43/08 360/314 |

(Continued)

*Primary Examiner* — Tri M Hoang
(74) *Attorney, Agent, or Firm* — Van Pelt, Yi & James LLP

(57) ABSTRACT

A magnetic device and method for programming the magnetic device are described. The magnetic device includes a plurality of magnetic junctions and at least one spin-orbit interaction (SO) active layer having a plurality of sides. The SO active layer(s) carry a current in direction(s) substantially perpendicular to the plurality of sides. Each of the magnetic junction(s) is adjacent to the sides and substantially surrounds a portion of the SO active layer. Each magnetic junction includes a free layer, a reference layer and a nonmagnetic spacer layer between the pinned and free layers. The SO active layer(s) exert a SO torque on the free layer due to the current passing through the SO active layer(s). The free layer is switchable between stable magnetic states. The free layer may be written using the current and, in some aspects, another current driven through the magnetic junction.

18 Claims, 11 Drawing Sheets

(56) References Cited

U.S. PATENT DOCUMENTS

| | | | |
|---|---|---|---|
| 8,520,432 B2 | 8/2013 | Lu | |
| 9,490,297 B1 * | 11/2016 | Braganca | H01L 21/28 |
| 9,490,421 B2 | 11/2016 | Apalkov | |
| 2003/0183889 A1 * | 10/2003 | Kajiyama | G11C 11/155 257/421 |
| 2006/0279980 A1 | 12/2006 | Haratani | |
| 2007/0236978 A1 * | 10/2007 | Wilson | G11C 11/14 365/55 |
| 2010/0003767 A1 * | 1/2010 | Cho | H01L 43/08 438/3 |
| 2014/0175577 A1 * | 6/2014 | Apalkov | H01L 43/08 257/421 |
| 2017/0148848 A1 * | 5/2017 | Ahn | H01L 43/10 |
| 2018/0151212 A1 * | 5/2018 | Lim | G11C 11/1693 |
| 2018/0268888 A1 * | 9/2018 | Ohsawa | H01L 27/222 |

\* cited by examiner

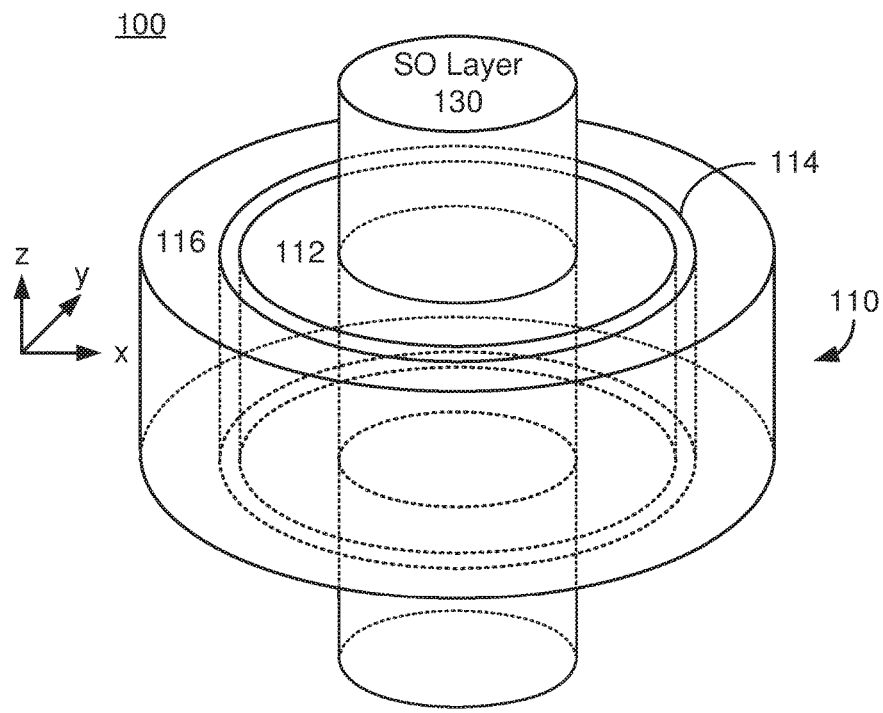
FIG. 1A
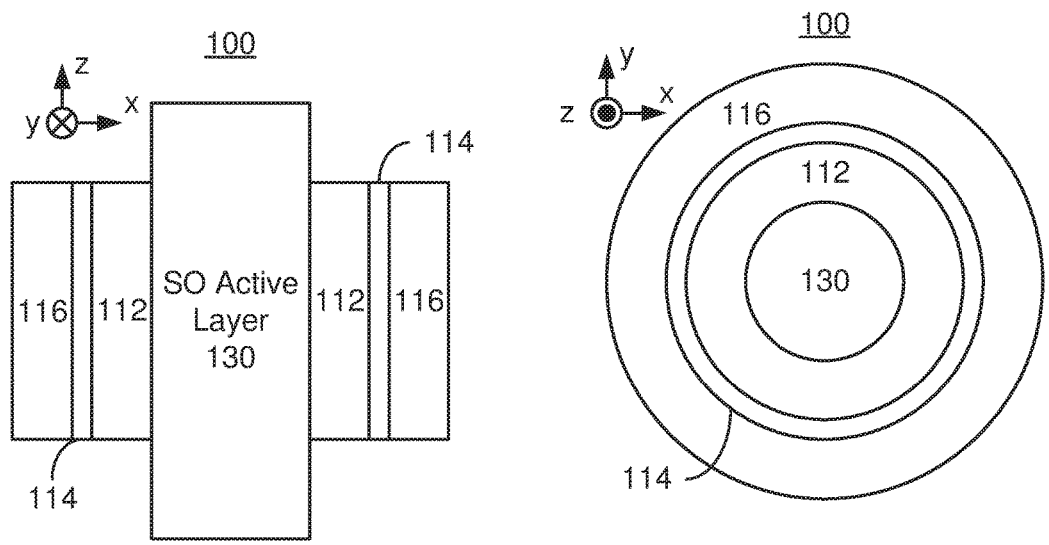
Fig. 1B
FIG. 1C

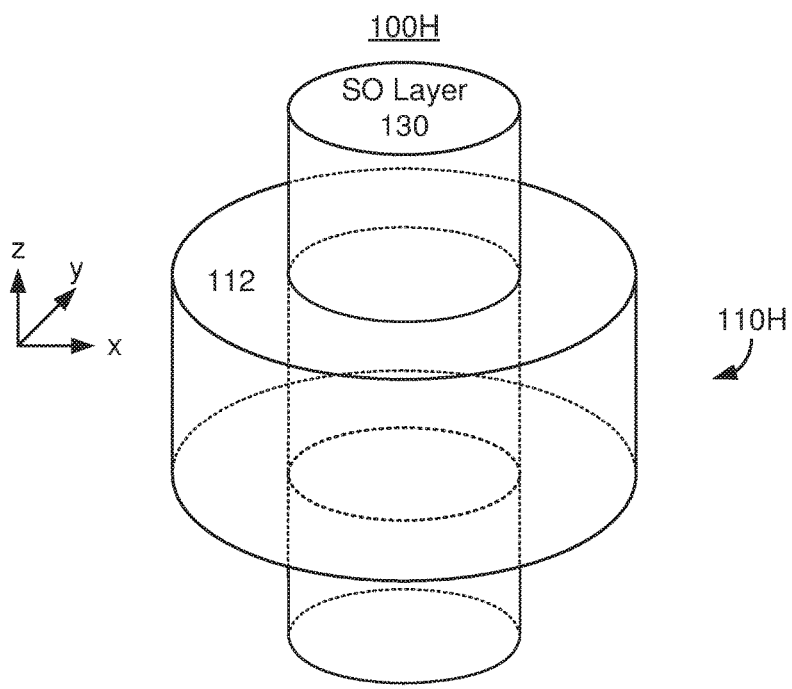
FIG. 8A
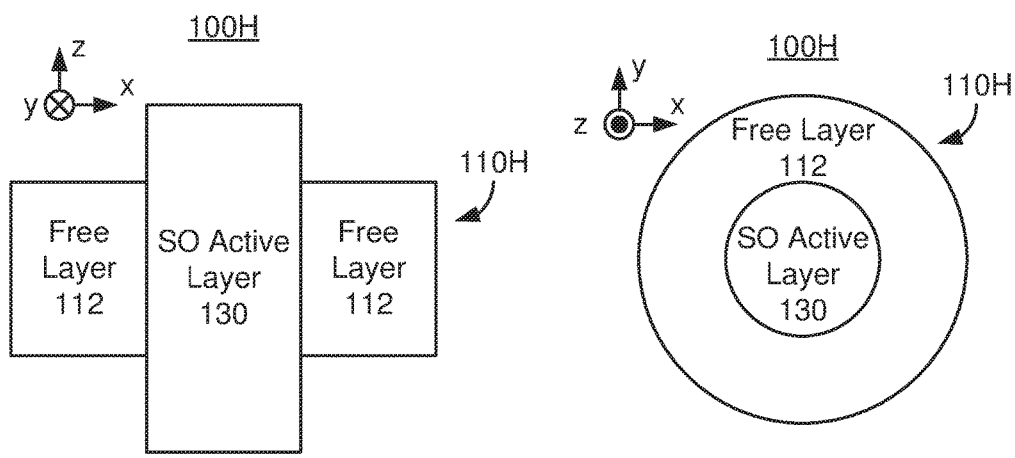
Fig. 8B
FIG. 8C

VERTICAL SPIN ORBIT TORQUE DEVICES

CROSS-REFERENCE TO RELATED APPLICATIONS

This application claims the benefit of provisional Patent Application Ser. No. 62/637,596, filed Mar. 2, 2018, entitled VERTICAL SPIN ORBIT TORQUE DEVICES INCLUDING MAGNETIC RANDOM ACCESS MEMORY, assigned to the assignee of the present application, and incorporated herein by reference.

BACKGROUND OF THE INVENTION

Magnetic memories, particularly magnetic random-access memories (MRAMs), have drawn increasing interest due to their potential for high read/write speed, excellent endurance, non-volatility and low power consumption during operation. An MRAM can store information utilizing magnetic materials as an information recording medium. Some magnetic memories write to the magnetic material using a current. One such magnetic memory programs magnetic junctions using spin-orbit interaction (SO) torque.

SO torque-based memories, such as a SO torque magnetic random-access memory (SOT-MRAM), utilize conventional magnetic tunneling junctions (MTJs) in conjunction with a line having a high spin-orbit interaction (hereinafter SO line). The conventional MTJ includes a pinned (or reference) layer, a free layer and a tunneling barrier layer between the pinned and free layers. The MTJ typically resides on a substrate and may include seed and capping layer(s) as well as an antiferromagnetic (AFM) layer. The reference layer and the free layer are magnetic. The magnetization of the reference layer is fixed, or pinned, in a particular direction. The free layer has a changeable magnetization. The reference layer and free layer may have their magnetizations oriented perpendicular to the plane of the layers (perpendicular-to-plane) or in the plane of the layers (in-plane). The SO line is adjacent to the free layer of the conventional MTJ. The high spin-orbit interaction may be due to a bulk effect of the material itself (spin Hall effect), due to interfacial interactions (Rashba effect), some other effect and/or some combination thereof.

In conventional SO memories, writing is performed by driving a current in-plane (CIP) through the SO line. If the free layer magnetic moment is stable in-plane, then the in-plane SO torque alone can switch the free layer between stable states. Thus, a current driven through the adjacent SO line generates an SO torque that may switch the direction of magnetization of the free layer without additional switching mechanism(s). In contrast, if the free layer has a magnetic moment that is stable perpendicular-to-plane, then an additional torque is used. Since the spin orbit torque is in-plane, in order to reliably switch the magnetic moment using the in-plane current, a symmetry breaking additional torque is required, and can be achieved by either modest external magnetic field, an in-stack magnetic bias, or STT torque through MgO barrier. The in-plane current develops an SO torque, which can be used to rotate the free layer magnetic moment from vertical to near in-plane direction. Switching to the desired direction is completed using the external magnetic bias or STT current. For example, the external magnetic field, an additional AFM layer or biasing structure may magnetically bias the free layer to complete switching to the desired state.

Although the conventional magnetic junction may be written using spin transfer and used in a spin transfer torque random access memory (STT-RAM), there are drawbacks. In general, SO torque is not an efficient mechanism for switching the free layer. Stated differently, the SO angle (measure of this efficiency of SO torque) is generally small. Thus, a high write current may be required for writing. In addition, the spin current in regions not adjacent to the magnetic is not used in writing. Thus, this spin current may be wasted. Memory cells using SO torque may have a large footprint because a three-terminal device may be used for write and read operations. Perpendicular magnetic moments in the layers of the magnetic junction may also not be usable in some embodiments. Thus, scalability may be limited. Consequently, a mechanism for improving SO torque magnetic devices is still desired.

BRIEF SUMMARY OF THE INVENTION

A magnetic device and method for programming the magnetic device are described. The magnetic device includes a plurality of magnetic junctions and at least one spin-orbit interaction (SO) active layer having a plurality of sides. The SO active layer(s) carry a current in direction(s) substantially perpendicular to the plurality of sides. Each of the magnetic junction(s) is adjacent to the sides and substantially surrounds a portion of the SO active layer. Each magnetic junction includes a free layer, a reference layer and a nonmagnetic spacer layer between the pinned and free layers. The SO active layer(s) exert a SO torque on the free layer due to the current passing through the SO active layer(s). The free layer is switchable between stable magnetic states. The free layer may be written using the current and, in some aspects, another current driven through the magnetic junction.

Performance of magnetic devices using magnetic junctions written using SO torque may be improved. For example, the interface for the spin current may be enhanced, the design may be scalable, fewer selection devices might be used, switching time might be reduced, read and write may be separately optimized, and/or breakdown of a tunneling barrier used in some aspects may be reduced.

BRIEF DESCRIPTION OF SEVERAL VIEWS OF THE DRAWINGS

FIGS. 1A-1C depict perspective, cross-section and top views of an exemplary embodiment of a magnetic device including vertical magnetic junctions programmable using SO torque.

FIGS. 8A-8C depict perspective, cross-section and top views of an exemplary embodiment of a magnetic device including vertical magnetic junctions programmable using SO torque.

DETAILED DESCRIPTION OF THE INVENTION

Figure 2A:
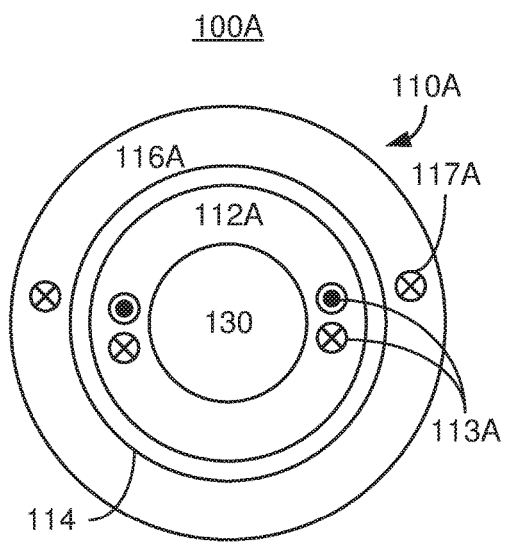
FIGS. 2A-2C depict exemplary embodiments of the magnetic moment of a vertical magnetic junction.

The exemplary embodiments relate to magnetic junctions usable in magnetic devices, such as magnetic memories and/or logic devices, and the devices using such magnetic junctions. The magnetic memories may include magnetic random-access memories (MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown but is to be accorded the widest scope consistent with the principles and features described herein.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin orbit interaction phenomenon, magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A magnetic device and method for programming the magnetic device are described. The magnetic device includes a plurality of magnetic junctions and at least one spin-orbit interaction (SO) active layer having a plurality of sides. The SO active layer(s) carry a current in direction(s) substantially perpendicular to the plurality of sides. Each of the magnetic junction(s) is adjacent to the sides and substantially surrounds a portion of the SO active layer. Each magnetic junction includes a free layer, a reference layer and a nonmagnetic spacer layer between the pinned and free layers. The SO active layer(s) exert a SO torque on the free layer due to the current passing through the SO active layer(s). The free layer is switchable between stable magnetic states. The free layer may be written using the current and, in some aspects, another current driven through the magnetic junction.

FIGS. 1A-1C depict perspective, cross-section and top views of an exemplary embodiment of a magnetic device 100 including a vertical magnetic junction 110 programmable using SO torque. For clarity, FIGS. 1A-1C are not to scale. In addition, portions of the magnetic device 100 such as bit lines, row and column selectors are not shown. The magnetic device 100 includes magnetic junctions 110 and a spin-orbit interaction (SO) active layer 130 analogous to the SO line described above. In some embodiments, selection devices (not shown) and other components may also be included. Not shown is an optional insertion layer that may be between the SO active layer 130 and the magnetic junction 110. Typically, multiple magnetic junctions 110 and multiple SO active layer 130 may be included in the magnetic device 100. The magnetic device 100 may be used in a variety of electronic devices.

The magnetic junction 110 includes a free layer 112, a nonmagnetic spacer layer 114 and a reference layer 116. The magnetic junction 110 may also include optional polarization enhancement layer(s) (PEL(s)) having a high spin polarization. For example, a PEL might include Fe, CoFe and/or CoFeB. The PEL may be between the reference layer 116 and the nonmagnetic spacer layer 114 and/or between the nonmagnetic spacer layer 114 and the free layer. Contact, optional seed layer(s) and optional capping layer(s) may be present but are not shown for simplicity. An optional pinning layer (not shown) may be used to fix the magnetization (not shown) of the reference layer 116. The optional pinning layer may be an AFM layer or multilayer that pins the magnetization (not shown) of the reference layer 116 by an exchange-bias interaction. However, in other embodiments, the optional pinning layer may be omitted or another structure may be used. In other embodiments, discussed below, the reference layer 116 and nonmagnetic spacer layer 114 might be omitted.

Also not shown in FIGS. 1A-1C is the underlying substrate on which the components 110 and 130 are grown. In some embodiments, the substrate is in the x-y plane. In such an embodiment, the z direction is perpendicular to the plane and vertical. In such embodiments, the magnetic junction 110 has the plane of its layers 112, 114 and 116 perpendicular to the plane of the substrate. Stated differently, the interfaces between the layers 112, 114 and 116 would be at a nonzero angle from the substrate surface (not shown). In the embodiment shown, if the substrate is in the x-y plane, the interfaces are substantially perpendicular to the substrate. Consequently, the magnetic junction 110 may be considered to be a vertical magnetic junction. In other embodiments, the interfaces between the layers 112, 114 and 116 may be tilted with respect to the substrate. For example, if the magnetic junction 110 is conical in profile instead of cylindrical or if the magnetic junction is cylindrical but has an axis that is not parallel to the z-axis. In other embodiments, the substrate oriented in another manner. For example, the substrate might be in the x-z plane or the y-z plane. In such embodiments, the axis of the SO active layer 130 is horizontal. In such embodiments, a portion of the magnetic junction 110 lies below the SO active layer 130. However, such embodiments may be difficult to fabricate.

The reference layer 116 is magnetic and may be a multilayer. For example, the reference layer 116 may be a synthetic antiferromagnet (SAF) including multiple ferromagnetic layers interleaved with and sandwiching nonmagnetic layer(s) such as Ru. Other multilayers may be used in the reference layer 116. For example, the reference layer 116 may include or consist of one or more of CoFe, CoFeB, FeB, and/or CoPt. Note that as used herein CoFeB, FeB, CoB, CoPt and other materials listed denote alloys in which the stoichiometry is not indicated. For example, CoFeB may include $(CoFe)_{1-x}B_x$, where x is greater than or equal to zero and less than or equal to 0.5 as-deposited. For example, x may be at least 0.2 and not more than 0.4. Other materials and/or structures are possible for the reference layer 116. The magnetic moment of the reference layer 116 may take on various configurations that are discussed below.

The nonmagnetic NM spacer layer 114 is between reference layer 116 and the free layer 112. The nonmagnetic spacer layer 114 may be a tunneling barrier layer. For example, the nonmagnetic spacer layer 114 may include or consist of MgO, aluminum oxide and/or titanium oxide. The MgO layer may be crystalline and have a 200 orientation for enhanced tunneling magnetoresistance (TMR). In other embodiments, the nonmagnetic spacer layer 114 may be a different tunneling barrier layer, may be a conductive layer or may have another structure.

The free layer 112 is magnetic and may be a multilayer. The free layer 112 may be a SAF or other multilayer. For example, the free layer 112 may include or consist of one or more of CoFe, CoFeB and/or Fe. The magnetic moment of the free layer 112 may have various stable states that are discussed below. The free layer is adjacent to the sides of the SO active layer 130. In the embodiment shown, the sides of the SO active layer 130 are cylindrical and perpendicular to the x-y plane. The free layer 112 is substantially perpendicular to the x-y plane and cylindrical. In the embodiment shown in FIGS. 1A-1C, the free layer 112 adjoins, or shares an interface with, at least a portion of the sides of the SO active layer 130. In another embodiment, a thin layer may be inserted between the free layer 112 and the SO active layer 130. For example, such a layer may moderate/enhance SO torque. Although shown in FIGS. 1A-1C as completely surrounding the sides of the SO active layer 130 that are adjacent to the magnetic junction 110, in other embodiments the free layer 112 may not completely enclose the SO active layer 130. For example, there may be a section missing from the magnetic junction 110 shown in FIGS. 1A-1C. In some embodiments, for example, not more than half of the magnetic junction on one side of the SO active layer 130 may be omitted. However, a magnetic junction 110 that completely surrounds a portion of the sides of the SO active layer 130 is generally desired.

The magnetic junction 110 is configured such that the free layer 112 is switchable between stable magnetic states using a write current which is passed through the SO active layer 130 along the axis of the SO active layer 130 (e.g. along the z axis/±z direction in FIGS. 1A-1C). Thus, the free layer 112 is programmable using SO torque. In some embodiments, the free layer 112 is programmable in the absence of a write current driven through the magnetic junction 110. Stated differently, spin transfer torque (STT) is not needed to write to the magnetic junction 110 in some embodiments. In alternate embodiments, however, a modest current driven through the magnetic junction 110 and/or an external magnetic field/magnetic bias may be used to assist in switching the free layer magnetic moment.

The SO active layer 130 is a layer that has a strong spin-orbit interaction and is used in switching the magnetic moment (not shown) of the free layer 112. For example, the SO active layer may include or consist of materials having a large SO angle with large spin-orbit coupling such as one or more of T, W, IrMn, or Pt, or a topological insulator, such as BiTe, BiSe, BiSb, and/or SbTe. Although termed a "layer", in the embodiment shown in FIGS. 1A-1C, the current carrying line 130 consists of the SO active material. Thus, when used in connection with the SO materials, the term layer need not imply a particular shape or orientation to the substrate. For example, the SO active layer 130 need not be a thin, rectangular or planar. Although the line 130 consists of the SO active layer 130 in FIGS. 1A-1C, in other embodiments, the line 130 may include other materials. For example, a higher conductivity material may replace or supplement the SO active layer 130 in regions distal from the magnetic junction 110. In other embodiments, a higher resistivity/lower conductivity core might be used. A write current is driven along the length of the SO active layer 130 in the +z direction or the −z direction. This write current gives rise to an attendant SO interaction, which results in a spin-orbit torque used in writing to the free layer 112.

Figure 2B:
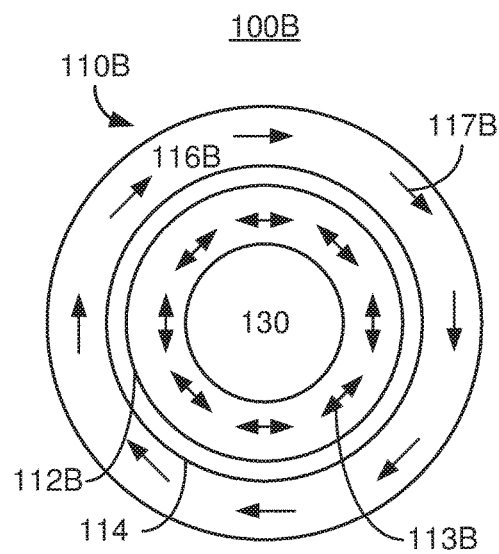
Figure 2C:
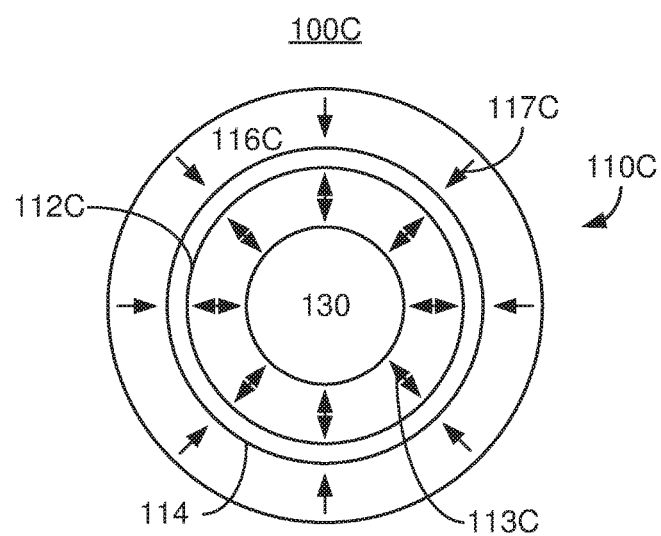

As discussed above, the stable magnetic states of the free layer 112, as well as the reference layer 116, may take on various configurations. FIGS. 2A-2C depict exemplary embodiments of magnetic devices 100 and the magnetic moment of vertical magnetic junction 110A, 110B and 110C. The magnetic junctions 110A, 110B and 110C are analogous to the magnetic junction 110. The magnetic junction 110A includes free layer 112A, nonmagnetic spacer layer 114 and reference layer 116A that are analogous to the free layer 112, nonmagnetic spacer layer 114 and reference layer 116, respectively. Consequently, the structure, function and materials used in the layers 112A, 114 and 116A are analogous to those for the layers 112, 114 and 116. However, the magnetic moments 113A and 117A of the free layer 112A and reference layer 116A, respectively, are explicitly shown. The reference layer magnetic moment 117A is along the z-axis. The free layer stable states are along the +z-direction and the −z-direction. Stated differently, the free layer 112 has its easy axis parallel to the z-axis shown in FIG. 1A. The magnetic device 100A may have improved scalability, may have fast switching (e.g. less than 0.5 nanoseconds) and may be thermally stable, but may require large current densities for switching in some embodiments.

The magnetic junction 110B includes free layer 112B, nonmagnetic spacer layer 114 and reference layer 1168 that are analogous to the free layer 112, nonmagnetic spacer layer 114 and reference layer 116, respectively. Consequently, the structure, function and materials used in the layers 112B, 114 and 1168 are analogous to those for the layers 112, 114 and 116. However, the magnetic moments 1138 and 1178 of the free layer 112B and reference layer 1168, respectively, are explicitly shown. The reference layer magnetic moment 1178 circulates around the z-axis and, therefore, around the SO active layer 130. The free layer stable states also circulate around the z-axis. The magnetic device 1008 may have improved scalability, may use lower current densities for switching (e.g. less than 3 MA/cm$^2$) and may be thermally stable, but may require larger switching times (e.g. greater than 10 nanoseconds).

The magnetic junction 110C includes free layer 112C, nonmagnetic spacer layer 114 and reference layer 116C that are analogous to the free layer 112, nonmagnetic spacer layer 114 and reference layer 116, respectively. Consequently, the structure, function and materials used in the layers 112C, 114 and 116C are analogous to those for the layers 112, 114 and 116. However, the magnetic moments 113C and 117C of the free layer 112C and reference layer 116C, respectively, are explicitly shown. The reference layer magnetic moment 117C is radial. In the embodiment shown, the moment 117C is toward the z-axis. In another embodiment, the moment 117C might be radial away from the z-axis. Similarly, the free layer stable states are also radial. The magnetic device 100C may deliver intermediate performance. For example, the magnetic device 100C have improved scalability, may use interfacial perpendicular magnetic anisotropy (I-PMA) for improved thermal stability, may use intermediate current densities (e.g. greater than 20 MA/cm$^2$) and may have somewhat smaller switching times (e.g. <1 nanosecond), but may be less thermally stable.

Thus, three particular configurations of magnetic moments are shown in magnetic junctions 110A, 110B and 110C. In another embodiment, other configurations might be used.

Referring back to FIGS. 1A-1C, the magnetic junction 110 may be read in a conventional manner. Thus, a read current insufficient to program the magnetic junction 110 using STT may be driven through the magnetic junction 110 in the direction perpendicular to at least some of the interfaces between the layers 112, 114 and 116. In the embodiment shown, the current may be driven radially (perpendicular to the z-axis) or in another direction such as along the y axis or along the x-axis. The resistance of the magnetic junction 110 is based on the orientation between the free layer magnetic moment and the reference layer magnetic moment. Thus, data may be read from the magnetic junction 110 by determining the resistance of the magnetic junction 110. The magnetic junctions 110A, 110B and 110C may be read in an analogous manner.

In programming the magnetic junction 110, however, a write current is driven through the SO active layer 130 and substantially perpendicular to the sides of the SO active layer 130 adjacent to the free layer 112. In the embodiment shown, this is along the z axis. Based on the direction of current, spins polarized in opposite directions may drift to opposing sides of the SO active layer 130. Because the free layer 112 and magnetic junction 110 substantially surround the sides of the SO active layer 130, all of these polarized spins may be used in writing to the free layer 112. In some embodiments, the stable magnetic states of the free layer 112 are configured such that the SO torque due to these spins can switch the magnetic state of the free layer 112.

Figure 3A:
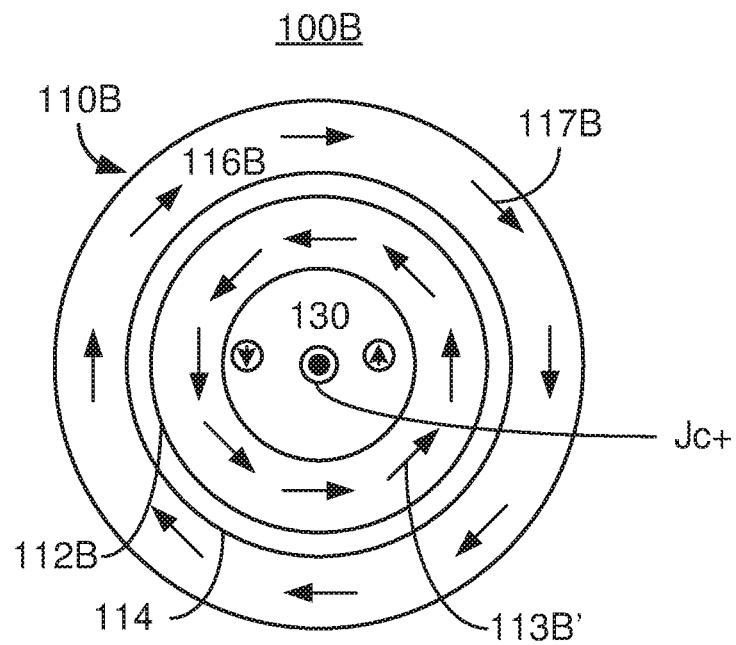
FIGS. 3A-3B depict exemplary embodiments the magnetic moment of a free layer after switching using SO torque.
Figure 3B:
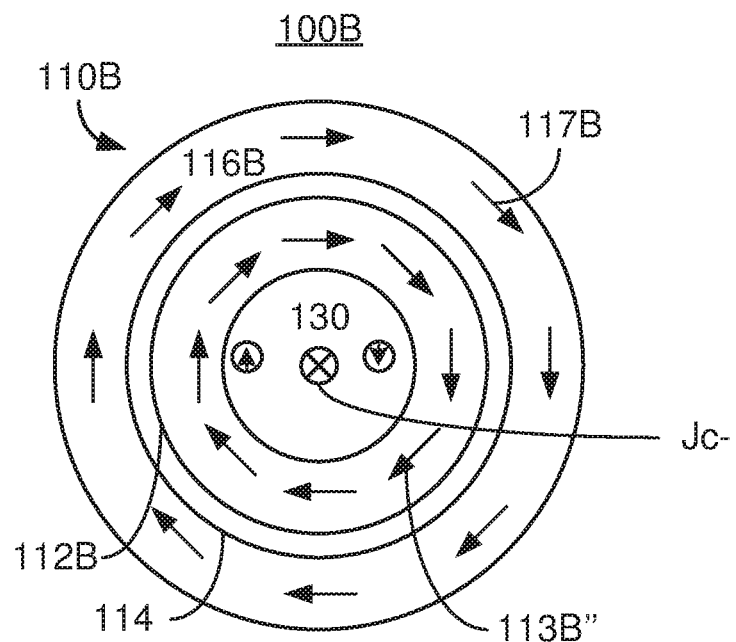

For example, FIGS. 3A-3B depict exemplary embodiments of the magnetic moment of a free layer in the magnetic junction 110B after switching using SO torque. As discussed above, the free layer 112B has stable states circulating around the z-axis (the SO active layer 130). Thus, FIGS. 3A-3B essentially depict the magnetic junction 110B during writing if the magnetic moments circulate around the SO active layer 130. FIG. 3A depicts the magnetic device 100/100B when the current is driven through the SO active layer 130 out of the plane of the page. Thus, current density Jc+ is shown. Because of the SO effect, spins migrate to the sides of the SO active layer 130, as shown. The spins on one side of the SO active layer 130 have opposite polarization to spins on the opposite side of the SO active layer 130. These spins have exerted an SO torque on the free layer 112, causing the free layer magnetic moment 113B' to be in the direction shown.

In contrast, FIG. 3B depicts the magnetic device 100/100B when the current is driven through the SO active layer 130 into the plane of the page. Thus, current density Jc− is shown. Because of the SO effect, spins migrate to the sides of the SO active layer 130, as shown. The spins on one side of the SO active layer 130 still have opposite polarization to spins on the opposite side of the SO active layer 130. However, the orientations have flipped. These spins have exerted an SO torque on the free layer 112, causing the free layer magnetic moment 113B" to be in the direction shown. Thus, in the embodiment shown in FIGS. 3A and 3B, the free layer 112 may be programmed using only an SO current Jc+/Jc− through the SO active layer 130. In other embodiments, the programming might be assisted by an additional current and/or a magnetic field. For example, an STT current may be driven through the magnetic junction 110B. Such a mechanism for programming could be used with the magnetic junctions 110B, 110C, and/or 110D having the stable states of the free layer magnetic moment circulating around the z-axis, oriented radially with respect to the z-axis or along the z-axis. In such embodiments, the STT current may be used to select a final direction of the magnetic moment. Thus, a more modest STT current may be used to switch the free layer 112 in such embodiments.

The magnetic devices 100, 100A, 100B and 100C may have improved performance. The free layer 112/112A/112B/112C may be programmed using SO torque and a current driven through the SO active layer 130. Because no STT write current is driven through the magnetic junction 110 for programming, damage to the magnetic junction 110 may be avoided. For example, breakdown of the tunneling barrier layer 114 may be circumvented. Even if an STT write current is driven through the magnetic junction 110/110A/110B/110C, the magnitude of the current may be smaller. Thus, damage to the magnetic junction 110/110A/110B/110C may be reduced or prevented. Moreover, the interface for the SO torque to act on the free layer 112/112A/112B/112C may be enhanced. As such, a smaller write current may be driven through the SO active layer 130 while still writing to the magnetic junction 110/110A/110B/110C. The configuration of the magnetic junction 110/110A/110B/110C and SO active layer 130 may be more scalable and switching time reduced. Writing may be primarily achieved using a current through the SO active layer, while reading performed using a current through the magnetic junction. As a result, read and write may be separately optimized.

Figure 4:
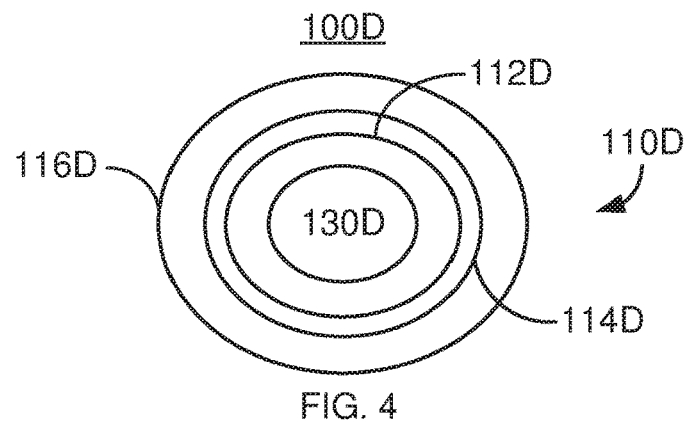
FIG. 4 depicts a top view of another exemplary embodiment of a magnetic device including vertical magnetic junctions programmable using SO torque.
Figure 5:
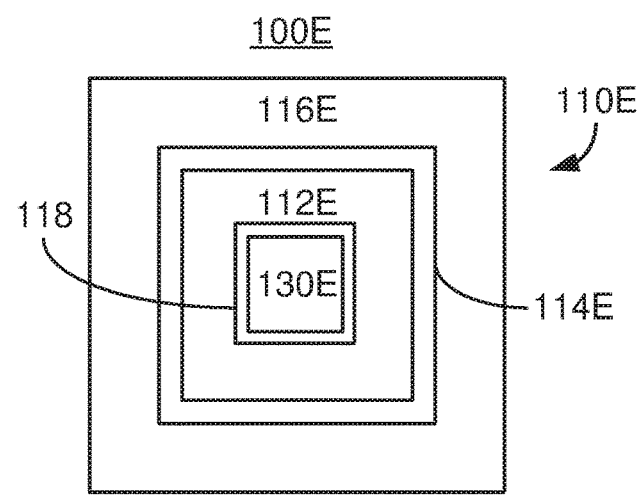
FIG. 5 depicts a top view of another exemplary embodiment of a magnetic device including vertical magnetic junctions programmable using SO torque.
Figure 6:
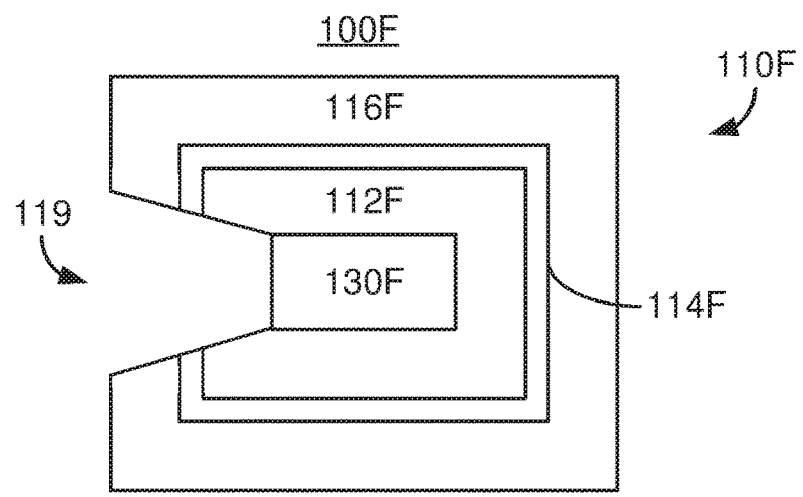
FIG. 6 depicts a top view of another exemplary embodiment of a magnetic device including vertical magnetic junctions programmable using SO torque.

FIGS. 4-6 depict top views of other exemplary embodiment of magnetic devices 100D, 100E and 100F, respectively, including vertical magnetic junctions 110D, 110E and 110F programmable using SO torque and SO active layer 130D, 130E and 130F. The magnetic junctions 110D, 110E and 110F are analogous to the magnetic junctions 110, 110A, 110B and 110C. The magnetic junction 110D includes free layer 112D, nonmagnetic spacer layer 114D and reference layer 116D that are analogous to the free layer 112, nonmagnetic spacer layer 114 and reference layer 116, respectively. Consequently, the structure, function and materials used in the layers 112D, 114D and 116D are analogous to those for the layers 112, 114 and 116. Similarly, the SO active layer 130D is analogous to the SO active layer 130. Consequently, the structure, function and materials used in the SO active layer 130D are analogous to those used in the SO active layer 130. The magnetic junction 110D and SO active layer 130D are elliptical in footprint instead of circular. Thus, the magnetic device 100 is not limited to a circular footprint.

The magnetic junction 110E includes free layer 112E, nonmagnetic spacer layer 114E and reference layer 116E that are analogous to the free layer 112, nonmagnetic spacer layer 114 and reference layer 116, respectively. Consequently, the structure, function and materials used in the layers 112E, 114E and 116E are analogous to those for the layers 112, 114 and 116. Similarly, the SO active layer 130E is analogous to the SO active layer 130. Consequently, the structure, function and materials used in the SO active layer 130E are analogous to those used in the SO active layer 130. The magnetic junction 110E and SO active layer 130E are square in footprint instead of circular. Thus, the magnetic device 100 is not limited to a circular footprint. In addition, an interlayer 118 is shown. This interlayer 118 resides between the SO active layer 130E and the free layer 112E. The layer 118 may be used to moderate (enhance and/or decrease) interaction between the free layer 112E and the SO active layer 130E. For example, the SO torque may be enhanced.

The magnetic junction 110F includes free layer 112F, nonmagnetic spacer layer 114F and reference layer 116F that are analogous to the free layer 112, nonmagnetic spacer layer 114 and reference layer 116, respectively. Consequently, the structure, function and materials used in the layers 112F, 114F and 116F are analogous to those for the layers 112, 114 and 116. Similarly, the SO active layer 130F is analogous to the SO active layer 130. Consequently, the structure, function and materials used in the SO active layer 130F are analogous to those used in the SO active layer 130. The magnetic junction 110E and SO active layer 130F are rectangular in footprint instead of circular. In addition, the magnetic junction 110F is shown as not completely surrounding the SO active layer 130F. Instead, aperture or slot 119 is present. However, as discussed above, in generally, it is desirable for the magnetic junction to surround the SO active layer in order to increase the area available for interaction via SO torque.

Figure 7A:
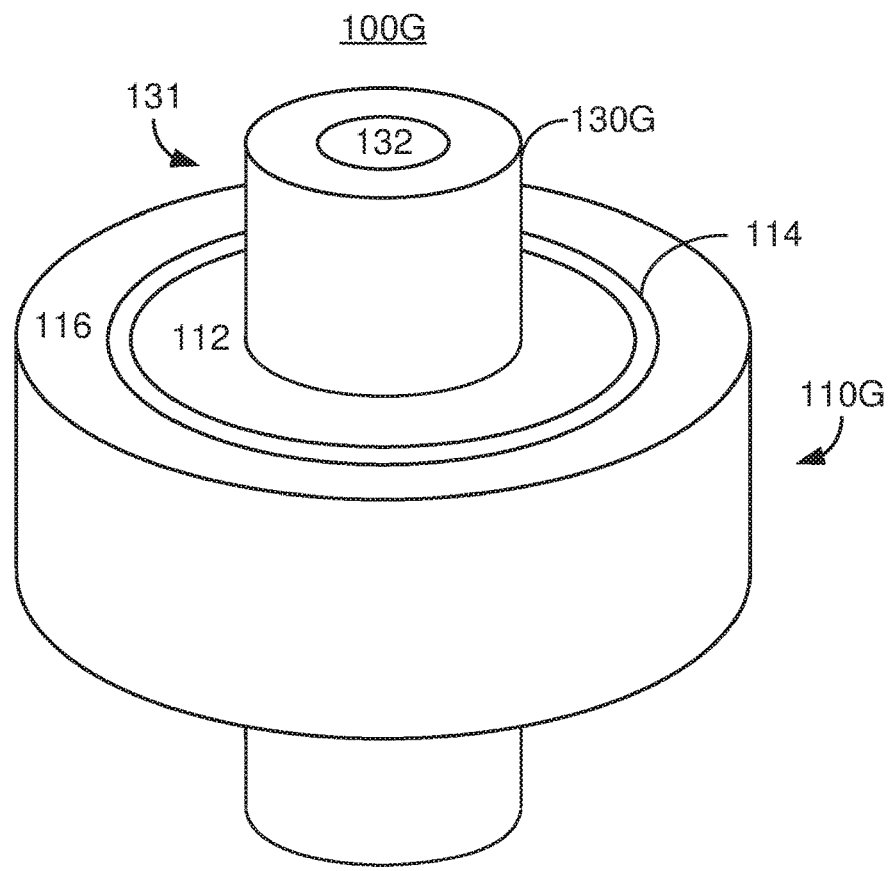
FIGS. 7A-7B depict perspective and top views of an exemplary embodiment of a magnetic device including vertical magnetic junctions programmable using SO torque.
Figure 7B:
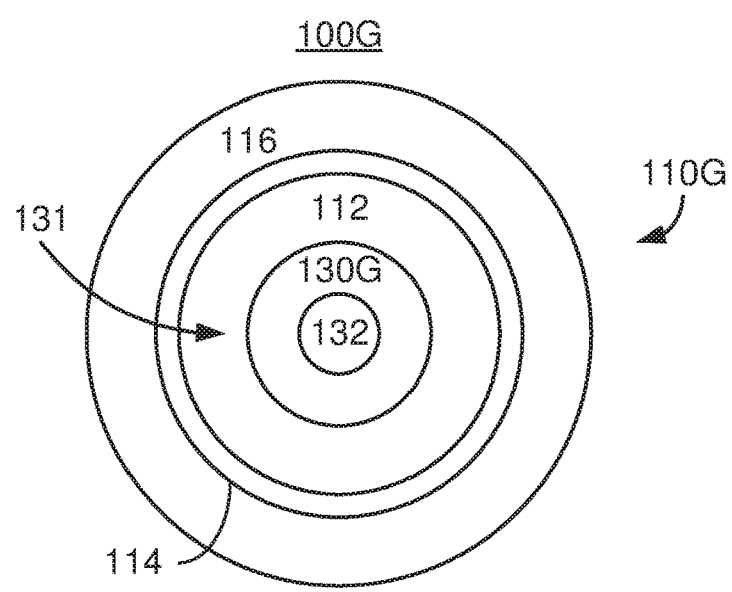

FIGS. 7A-7B depict perspective and top views of another exemplary embodiment of a magnetic device 100G including vertical magnetic junction(s) 110G programmable using SO torque. The magnetic junction 100G is analogous to the magnetic junctions 110, 110A, 110B, 110C, 110D, 110E and 110F. The magnetic junction 110E includes free layer 112, nonmagnetic spacer layer 114 and reference layer 116 that are analogous to the free layer 112, nonmagnetic spacer layer 114 and reference layer 116, respectively. Consequently, the structure, function and materials used in the layers 112, 114 and 116 of the magnetic junction 110G are analogous to those for the layers 112, 114 and 116 of the magnetic junction(s) 110, 110A, 110B, 110C, 110D, 110E and 110F. Similarly, the SO active layer 130E is analogous to the SO active layer 130. Consequently, the structure, function and materials used in the SO active layer 130E are analogous to those used in the SO active layer 130.

However, the line 131 includes both the SO active layer 130G and a core 132. The core 132 may have a lower conductivity/higher resistivity than the SO active layer 130G. For example, the core 132 may be formed of material(s) including but not limited to polysilicon, SiN and/or SiO.

The magnetic device 100G may share the benefits of the magnetic devices 100, 100A, 100B, 100C, 100D, 100E and/or 100F. In addition, the current may be preferentially carried through the SO active layer 130G, closer to the interface with the free layer 112. As a result, the SO active layer 130G and the line 131 may have improved efficiency in delivering SO torque to the free layer 112. Thus, performance of the magnetic device 100G may be further improved.

FIGS. 8A-8C depict perspective, cross-section and top views of an exemplary embodiment of a magnetic device 100H including a vertical magnetic junction 110H programmable using SO torque. For clarity, FIGS. 8A-8C are not to scale. In addition, portions of the magnetic device 100H such as bit lines, row and column selectors are not shown. The magnetic device 100H includes magnetic junctions 110H and a spin-orbit interaction (SO) active layer 130 analogous to the magnetic junction 110, 110A, 110B, 110C, 110D, 110E, 110F and/or 110G and SO active layer 130 and/or 130G described above. In some embodiments, selection devices (not shown) and other components may also be included. Not shown is an optional interlayer, such as layer 118, that may be between the SO active layer 130 and the magnetic junction 110H. Typically, multiple magnetic junctions 110H and multiple SO active layer 130 may be included in the magnetic device 100H. The magnetic device 100H may be used in a variety of electronic devices.

The magnetic junction 110H includes a free layer 112 that is analogous to the free layer 112 of the magnetic junction 110. Thus, the materials and configuration of the free layer 112 in the magnetic junction 110H is analogous to that in the magnetic junction 110. For example, the free layer 112 may be a SAF or other multilayer. The magnetic junction 110H may also include optional PEL(s) having a high spin polarization. Contact, optional seed layer(s) and optional capping layer(s) may be present but are not shown for simplicity. Although the free layer 112 is shown as adjoining the SO active layer 130, in other embodiments, a layer, such as interlayer 118, may be inserted between the sides of the SO active layer 130 and the free layer 112. Further, although shown as completely surrounding the sides of the SO active layer 130, in other embodiments, the free layer 112 may include an aperture or may terminate without completely surrounding the SO active layer 130.

Thus, the magnetic junction 100H includes a free layer 112. However, the nonmagnetic spacer layer 114 and a reference layer 116 of the magnetic junction 110 are omitted. Consequently, STT is not used in programming the free layer 112. In some embodiments, an external magnetic field may be used in addition to SO torque to write to the free layer 112. In addition, the magnetic junction 110H is read using a current driven along the z-axis through the SO active layer 130 that is insufficient to program the free layer 112.

Figure 9A:
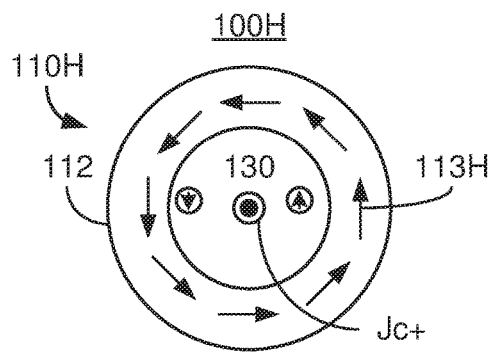
FIGS. 9A-9F depict cross-sectional views of an exemplary embodiment of a magnetic device including vertical magnetic junctions programmable using SO torque during writing and reading.
Figure 9B:
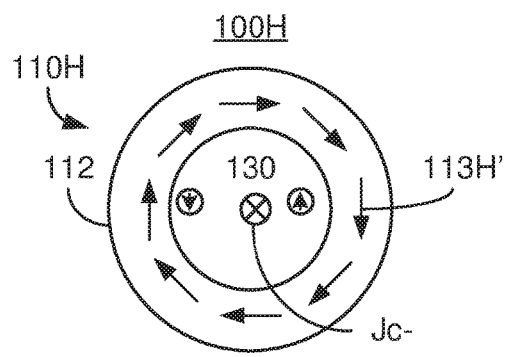

For example, FIGS. 9A-9F depict cross-sectional views of an exemplary embodiment of the magnetic device 100H including vertical magnetic junctions programmable using SO torque during writing and reading. FIGS. 9A and 9B depict the magnetic junction 100H just after having been programmed. FIG. 9A depicts the magnetic device 110H after a write current Jc+ has been driven through the SO active layer 130. Thus, the free layer 112 has been written such that its magnetic moment 113H is stable in the orientation shown. FIG. 9B depicts the magnetic junction 110H after write current Jc− has been driven through the SO active layer 130. Thus, the free layer 112 has been written such that its magnetic moment 113H' is stable in the opposite direction.

Figure 9C:
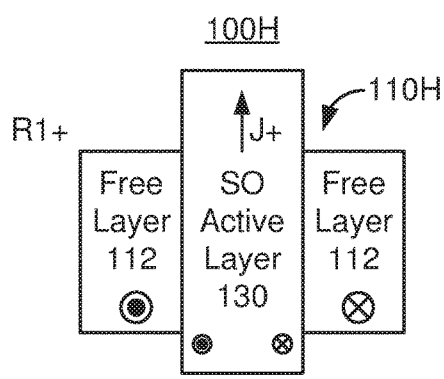
Figure 9D:
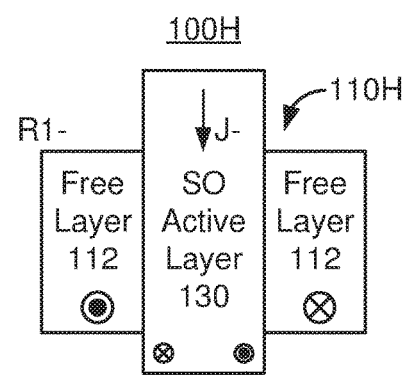

FIGS. 9C-9F depict side views of the magnetic device 100H during reading. The magnetic junction 100H is read using currents having current densities J+ and J− driven along the z-axis through the SO active layer 130. This current is insufficient to program the free layer 112. The state of the free layer 112 is read using the difference in resistance due to the configurations of the spins in the SO active layer 130 and the magnetic moment of the free layer 112. FIGS. 9C and 9D depict the magnetic device 100H when the free layer magnetic moment circulates around the SO active layer 130 as shown (out of the plane of the page on one side of the layer 130 and into the plane of the page on the other). In FIG. 9C, the current J+ results in spins of opposite orientation migrating to opposite sides of the SO active layer, as shown. With the current J+, the spins align with the magnetic moment of the free layer 112 and result in a resistance of R1+. As shown in FIG. 9D, the spins in the SO active layer 130 are opposite to the magnetic moment of the free layer 112. The resulting resistance is R1−. In addition, R1−>R1+. Thus, a differential measurement results in a negative difference in resistance between J+ and J−.

Figure 9E:
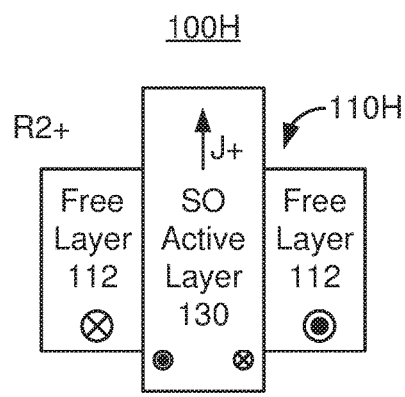
Figure 9F:
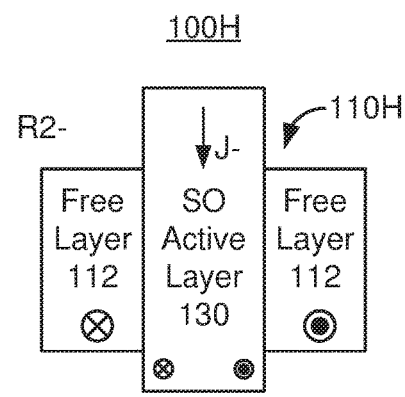

FIGS. 9E and 9F depict a resistance measurement when the free layer 112 has a magnetic moment in the opposite direction. The current J+ results in the spins migrating within the SO active layer 130 in the same manner as for FIG. 9C. However, in this case, the spins are in the opposite direction as the free layer magnetic moment and result in a resistance of R2+. For the current J−, the spins migrate as shown in FIG. 9D. However, the spins now align with the magnetic moment of the free layer 112 and result in a resistance R2−. Further, R2−<R2+. Thus, a differential resistance measurement results in a positive difference in resistance between J+ and J−. Thus, the magnetic junction 100H may be read and programmed using currents only through the SO active layer 130.

Although specific magnetic devices 100, 100A, 100B, 100C, 100D, 100E, 100F, 100G and 100H and particular magnetic junctions 110, 110A, 110B, 110C, 110D, 110E, 110F, 110G and 110H have been described herein, one of ordinary skill in the art will recognize that one or more of the features described herein may be combined in manners not explicitly shown.

Figure 10:
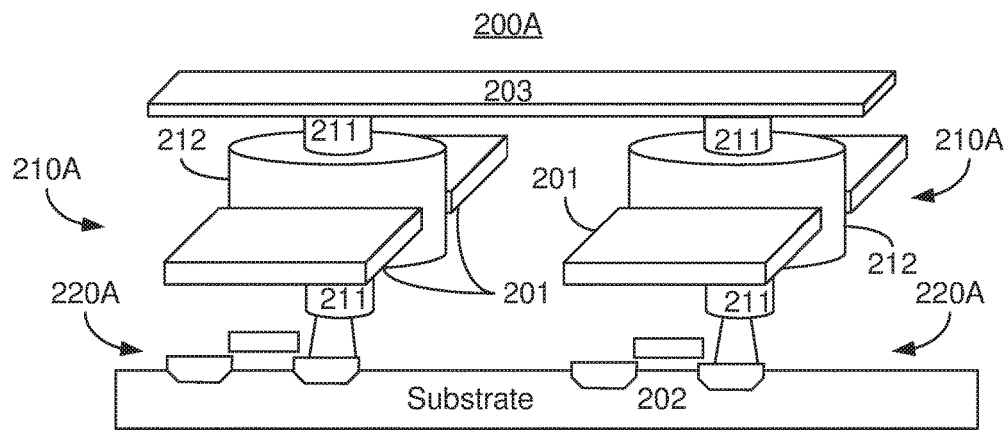
FIG. 10 depicts a perspective view of another exemplary embodiment of a magnetic memory including vertical magnetic junctions programmable using SO torque.

FIG. 10 is a perspective view of an exemplary embodiment of a memory 200A that may use one or more of the magnetic devices 100, 100A, 100B, 100C, 100D, 100E, 100F, 100G, 100H and/or other magnetic devices including a vertical magnetic junction written using SO torque. Only a portion of the magnetic memory 200A is shown. For example, reading/writing column select drivers as well as word line select driver(s) are not shown. Note that other and/or different components may be provided.

The memory 200A includes a substrate 202, lines 201 and 203 and memory cells 210A. Each memory cell 210A includes a selection transistor 220A, magnetic junction 212 and SO active layer 211. Although only one magnetic junction 212 per cell is shown, in other embodiments, additional magnetic junctions may be used. The SO active layer 211 is analogous to the SO active layer 130 and/or 130G/line 131. The magnetic junctions 212 are analogous to the magnetic junction(s) 110, 110A, 110B, 1100, 110D, 110E, 110F, 110G, 110H and/or another vertical magnetic junction. In addition, as can be seen by the orientation of the magnetic junctions 212 with respect to the substrate 202, the magnetic junctions 212 have interfaces (not shown) that may be substantially perpendicular to the substrate 202. The transistor 220A shown are planar transistors. In another embodiment, another selection device might be used. For example, an ovonic threshold selector (OTS) device might be used. In addition, also shown are lines 201 that may be used to drive current through the magnetic junction 212 for reading and/or writing. However, if a free layer only magnetic junction 100H is used, the lines 201 may be omitted. Because the magnetic memory 200A uses the magnetic junctions 212 and SO active layers 211, the magnetic memory 200A may enjoy the benefits described above.

Figure 11:
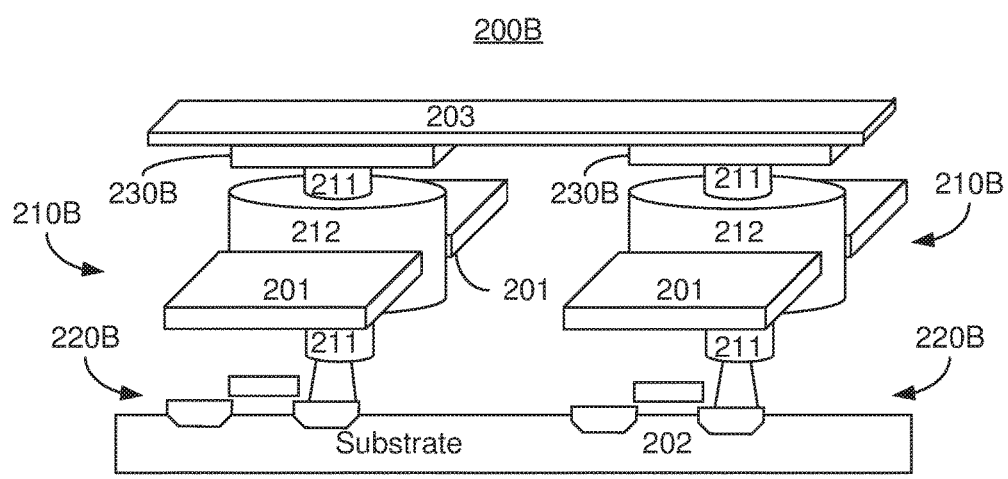
FIG. 11 depicts a perspective view of another exemplary embodiment of a magnetic memory including vertical magnetic junctions programmable using SO torque.

FIG. 11 is a perspective view of an exemplary embodiment of a memory 200B that may use one or more of the magnetic devices 100, 100A, 100B, 100C, 100D, 100E, 100F, 100G, 100H and/or other magnetic devices including a vertical magnetic junction written using SO torque. Only a portion of the magnetic memory 200B is shown. For example, reading/writing column select drivers as well as word line select driver(s) are not shown. Note that other and/or different components may be provided.

The memory 200B includes a substrate 202, lines 201 and 203 and memory cells 210B. Each memory cell 210B includes a selection transistor 220B, magnetic junction 212 and SO active layer 211. Although only one magnetic junction 212 per cell is shown, in other embodiments, additional magnetic junctions may be used. The SO active layer 211 is analogous to the SO active layer 130 and/or 130G/line 131. The magnetic junctions 212 are analogous to the magnetic junction(s) 110, 110A, 110B, 110O, 110D, 110E, 110F, 110G, 110H and/or another vertical magnetic junction. In addition, as can be seen by the orientation of the magnetic junctions 212 with respect to the substrate 202, the magnetic junctions 212 have interfaces (not shown) that may be substantially perpendicular to the substrate 202. The transistor 220B shown are planar transistors. In another embodiment, another selection device including but not limited to an OTS selection device might be used. Also shown are lines 201 that may be used to drive current through the magnetic junction 212 for reading and/or writing. However, if a free layer only magnetic junction 100H is used, the lines 201 may be omitted.

Also shown in FIG. 11 is additional selector 230B. The selector 230B may be an OTS selector or other analogous device. Because the magnetic memory 200B uses the magnetic junctions 212 and SO active layers 211, the magnetic memory 200B may enjoy the benefits described above. In addition, use of two selection devices 220B and 230B may reduce or eliminate the sneak path for current. As such, performance may be further improved.

Figure 12:
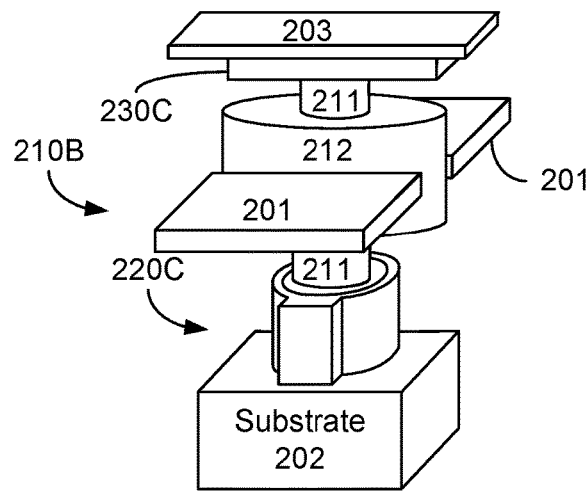
FIG. 12 depicts a perspective view of another exemplary embodiment of a magnetic memory including vertical magnetic junctions programmable using SO torque.

FIG. 12 is a perspective view of an exemplary embodiment of a memory 200C that may use one or more of the magnetic devices 100, 100A, 100B, 100C, 100D, 100E, 100F, 100G, 100H and/or other magnetic devices including a vertical magnetic junction written using SO torque. Only a portion of the magnetic memory 200C is shown. For example, reading/writing column select drivers as well as word line select driver(s) are not shown. Note that other and/or different components may be provided.

The memory 200C includes a substrate 202, lines 201 and 203 and memory cells 210C. Each memory cell 210C includes a selection transistor 220C, magnetic junction 212 and SO active layer 211. An optional second selection device 230C is also shown. Although only one magnetic junction 212 per cell is shown, in other embodiments, additional magnetic junctions may be used. The SO active layer 211 is analogous to the SO active layer 130 and/or 130G/line 131. The magnetic junctions 212 are analogous to the magnetic junction(s) 110, 110A, 110B, 110C, 110D, 110E, 110F, 110G, 110H and/or another vertical magnetic junction. In addition, as can be seen by the orientation of the magnetic junctions 212 with respect to the substrate 202, the magnetic junctions 212 have interfaces (not shown) that may be substantially perpendicular to the substrate 202. Also shown are lines 201 that may be used to drive current through the magnetic junction 212 for reading and/or writing. However, if a free layer only magnetic junction 100H is used, the lines 201 may be omitted. The transistor 220C shown are vertical (three-dimensional) transistors instead of planar transistors.

Because the magnetic memory 200C uses the magnetic junctions 212 and SO active layers 211, the magnetic memory 200C may enjoy the benefits described above. In addition, if two selection devices 220C and 230C are used, the sneak path for current may be reduced or eliminated. As such, performance may be further improved. Further, the magnetic memory 200C may be more scalable because of the use of three dimensional transistors 220C. Thus, the magnetic memory 200C may have enhanced performance.

Figure 13:
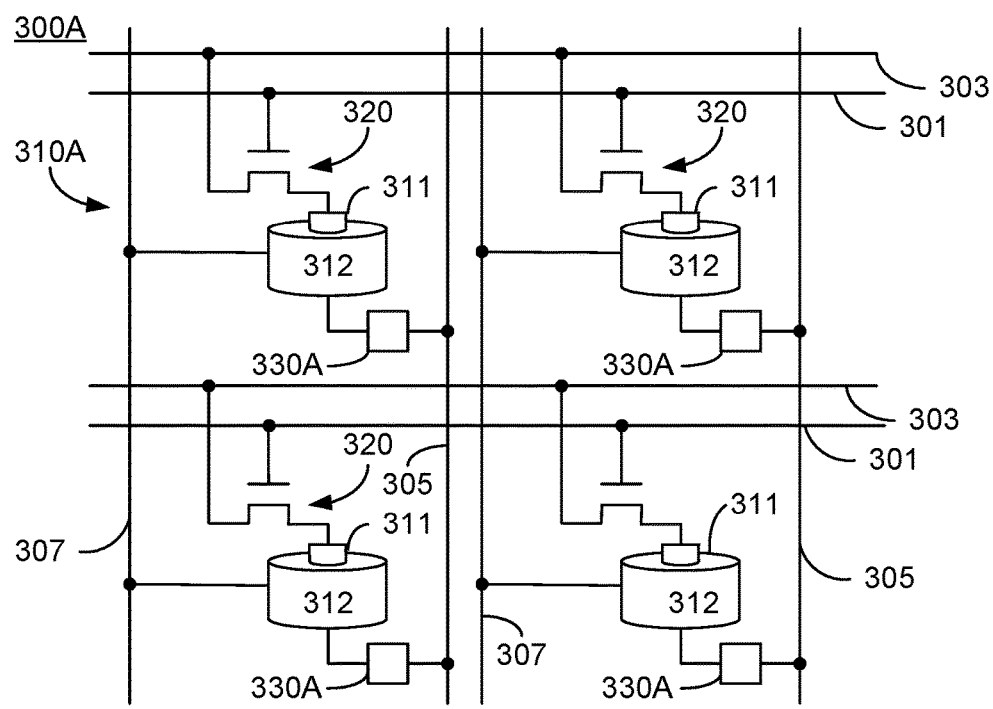
FIG. 13 depicts a circuit diagram of another exemplary embodiment of a magnetic memory including vertical magnetic junctions programmable using SO torque.

FIG. 13 depicts an exemplary embodiment of a schematic for a memory 300A that may use one or more of the magnetic devices 100, 100A, 100B, 100C, 100D, 100E, 100F, 100G, 100H and/or other magnetic devices including vertical magnetic junctions programmable using SO torque. Only a portion of the magnetic memory 300A is shown. For example, reading/writing column select drivers as well as word line select driver(s) are not shown. Note that other and/or different components may be provided.

The magnetic memory 300A includes word lines 301, Vcc/Vdd/ground/read voltage lines 303, Vcc/Vdd/ground/floating lines 305, output lines 307 that may connect to a sense amplifier, magnetic junctions 312, SO active layers 311, selection transistor 320 and optional additional selection device 330A. The components 311, 312, 320 and (optionally) 330A form cells 310A. For simplicity only one cell is labeled. Each magnetic junction 312 is shown as connected to line 307. However, if a free layer only magnetic junction 100H is used this connection may be omitted.

Because the magnetic memory 300A uses the magnetic junctions 312 and SO active layers 311, the magnetic memory 300A may enjoy the benefits described above. In addition, if two selection devices 320 and 330A are used, the sneak path for current may be reduced or eliminated. As such, performance may be further improved. If the transistor 320 is a vertical transistor such as the transistor 220C, the magnetic memory 300A may be more scalable. Thus, the magnetic memory 300A may exhibit improved performance.

Figure 14:
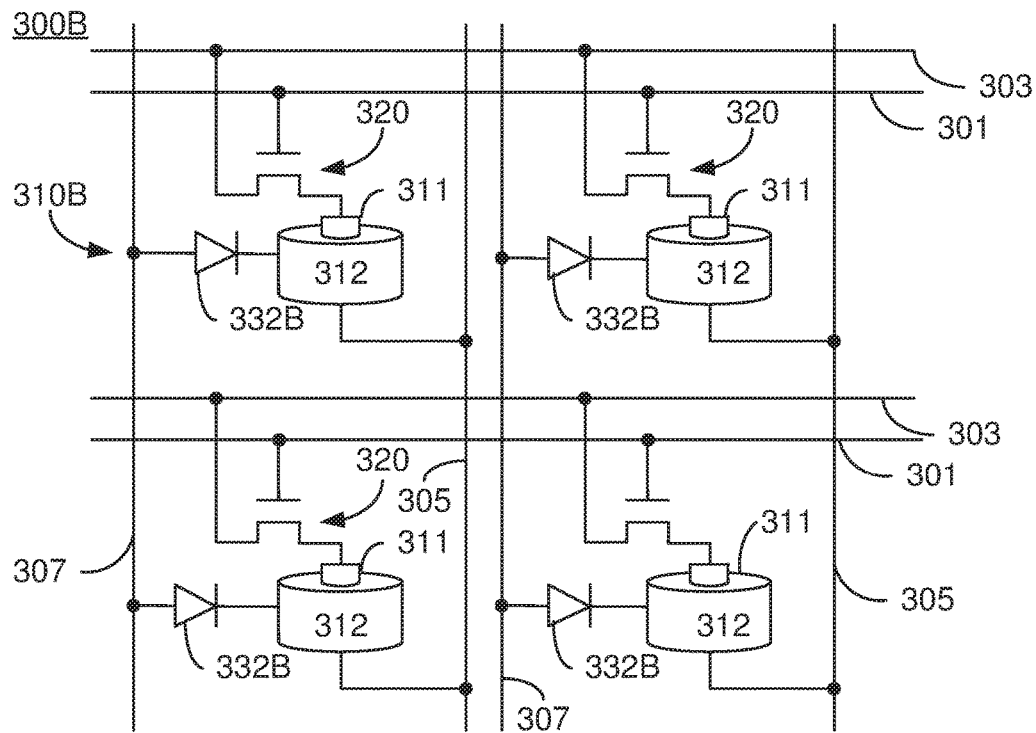
FIG. 14 depicts a circuit diagram of another exemplary embodiment of a magnetic memory including vertical magnetic junctions programmable using SO torque.

FIG. 14 depicts an exemplary embodiment of a schematic for a memory 300B that may use one or more of the magnetic devices 100, 100A, 100B, 100C, 100D, 100E, 00F, 100G, 100H and/or other magnetic devices including vertical magnetic junctions programmable using SO torque. Only a portion of the magnetic memory 300B is shown. For example, reading/writing column select drivers as well as word line select driver(s) are not shown. Note that other and/or different components may be provided.

The magnetic memory 300B is analogous to the magnetic memory 300A. Consequently, the magnetic memory 300B includes word lines 301, Vcc/Vdd/ground/read voltage lines 303, Vcc/Vdd/ground/floating lines 305, output lines 307 that may connect to a sense amplifier, magnetic junctions 312, SO active layers 311 and selection transistor 320 that are analogous to components 301, 303, 305, 307, 312, 311 and 320, respectively. The components 311, 312, 320 and (optionally) 332B form cells 310B. For simplicity only one cell is labeled. Each magnetic junction 312 is shown as connected to line 307. However, if a free layer only magnetic junction 100H is used this connection may be omitted.

Each memory cell 310B may include an optional diode 332B. The diode 332B may be used to eliminate the sneak path. In lieu of a diode 332B, another configuration that functions as a diode may be used.

Because the magnetic memory 300B uses the magnetic junctions 312 and SO active layers 311, the magnetic memory 300B may enjoy the benefits described above. In addition, if the diodes 332B are used, the sneak path for current may be reduced or eliminated. As such, performance may be further improved. If the transistor 320 is a vertical transistor such as the transistor 220C, the magnetic memory 300B may be more scalable. Thus, the magnetic memory 300B may exhibit improved performance.

Figure 15:
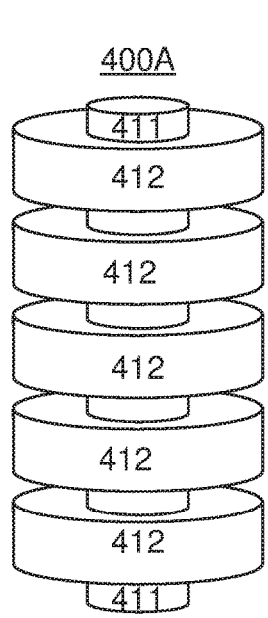
FIG. 15 depicts a perspective view of another exemplary embodiment of a magnetic device including multiple vertical magnetic junctions programmable using SO torque.
Figure 16:
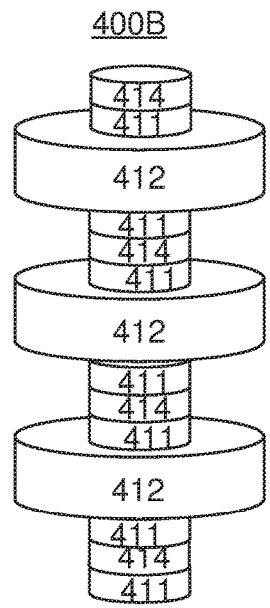
FIG. 16 depicts a perspective view of another exemplary embodiment of a magnetic device including multiple vertical magnetic junctions programmable using SO torque.

FIGS. 15-16 depict perspective views of other exemplary embodiments of a magnetic devices 400A and 400B including multiple vertical magnetic junctions 412 programmable using SO torque. The magnetic junctions 412 are analogous to the magnetic junction(s) 110, 110A, 110B, 110C, 110D, 110E, 110F, 110G, 110H and/or another vertical magnetic junction. Also shown are SO active layers 411 analogous to the SO active layers 130 and/or 130G/line 131. For simplicity, not all SO active layers 411 are labeled in FIG. 15. Although a particular number of magnetic junctions are shown in each magnetic device 400A and 400B, in other embodiments, other number(s) may be used. In the magnetic device 400B, isolation devices 414 are shown as interleaved between the magnetic junction 412. For example, the isolation devices 414 might be vertical transistors analogous to the transistor 220C. The magnetic devices 400A and/or 400B might be incorporated into a device utilizing the magnetic devices 100, 100A, 100B, 100C, 100D, 100E, 100F, 100G, 100H and/or an analogous device. For example, one or more of the magnetic memories 200A, 200B, 200C, 300A and/or 300B might use the magnetic device 400A and/or 400B.

In some embodiments, the magnetic junctions 412 may be individually programmed using a combination of current driven through the SO active layers 411 (i.e. using SO torque) and a current driven through the magnetic junction (e.g. STT torque). Such embodiments include those in which the SO torque is collinear with the magnetization, such as the magnetic junction 100S. For example, a write current that is insufficient to write to the magnetic junction 412 alone may be driven through the SO active layer 411. Each magnetic junction 412 to be written may simultaneously have an STT current driven through it. For example, the STT current may be radial or simply in a particular direction that allows the STT current to pass through the interface(s) between the layers of the magnetic junction 412. The combination of the currents driven in the appropriate directions writes to the desired magnetic junctions 412. In some embodiments, an STT current driven in one direction through the magnetic junctions 412 to be switched aids in programming, while an STT current driven in the opposite direction through magnetic junctions 412 not to be switched prevents writing to such magnetic junctions from being programmed. In other embodiments, a current is driven through the SO active layer 411. A small STT current may be driven through the magnetic junctions 412 desired to be written, for example to select the final direction of magnetization after programming. In some embodiments, the magnetic moment of the free layer of each magnetic junction 412 may be stable radially, in a manner analogous to the magnetic junction 100C. A current driven through the SO active layer may destabilize the magnetic moments such that the free layer magnetic moments circulate around the SO active layer 411. The final direction of magnetization may be set by applying a small STT current to the magnetic junction(s) 412 desired to be programmed. When the currents are removed, the magnetic junctions 412 are programmed in the desired radial direction. In another embodiment, the magnetic moment of the free layer of each magnetic junction 412 is stable axially (along the axis of the cylinder shown in FIGS. 15 and 16) in a manner analogous to the magnetic junction 100A. In such an embodiment, a current driven through the SO active layer may still destabilize the magnetic moments such that the free layer magnetic moments circulate around the SO active layer 411. The final direction of magnetization may be set by applying a small STT current to the magnetic junction(s) 412 desired to be programmed. This STT torque has an axial direction due to the magnetic moment of the reference layer. When the currents are removed, the magnetic junctions 412 are programmed in the desired axial direction.

Figure 17:
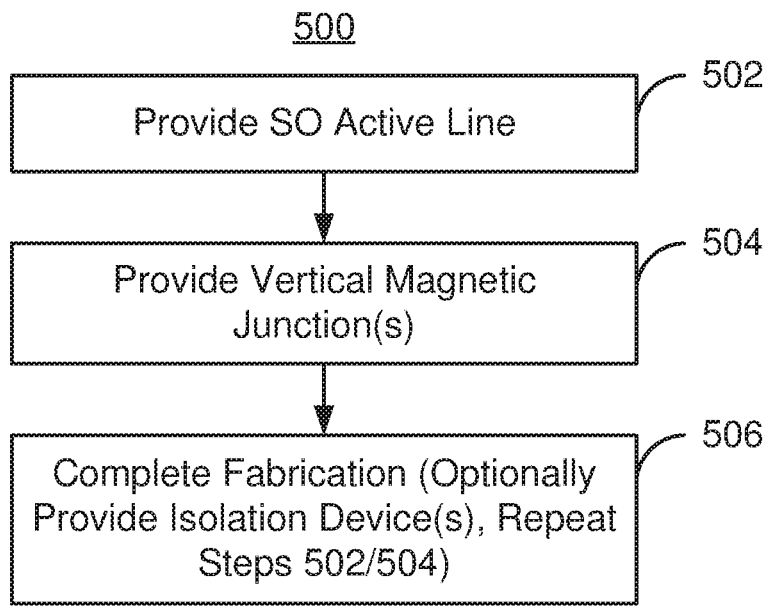
FIG. 17 is a flow chart depicting an exemplary embodiment of a method for providing a magnetic device programmable using SO torque in and including vertical magnetic junctions.

FIG. 17 depicts an exemplary embodiment of a method 500 for fabricating a magnetic device programmable using SO torque and including vertical magnetic junctions. For simplicity, some steps may be omitted, performed in another order, include substeps and/or combined. Further, the method 500 may start after other steps in forming a magnetic memory have been performed. For simplicity, the method 500 is described in the context of the magnetic device 100. However, other magnetic devices, including but not limited to the magnetic devices 100A, 100B, 100C, 100D, 100E, 100F, 100G and/or 100H may be formed.

At least one SO active layer 130 is provided, via step 502. Step 502 may include depositing and patterning the desired materials for each SO active layer 130. In some embodiments, step 502 includes forming the low conductivity core 132 and the SO active layer 130G on the core 132. Thus, a pillar may be formed in step 502. The interlay layer 118 may optionally be provided as part of step 502.

The magnetic junctions 110 may then be formed, via step 504. Step 504 may include blanket depositing the layers for the free layer 112, nonmagnetic spacer layer 114, reference layer 116 and any additional layers desired in the magnetic junction 110. Alternatively, the nonmagnetic spacer layer 114 and/or reference layer 114 might be omitted. Anneal(s) and/or other processing steps may also be performed. The magnetic junctions 110 may then be defined. For example, a planarization step may remove the portions of the magnetic junctions 110 connection layer 112, 114 and 116 and the SO active layer 130 physically exposed.

Fabrication may then be completed, via step 506. For example, isolation and/or selection devices may be formed. If magnetic devices 400A and/or 400B are to be fabricated, then subsequent SO active layers 130 and magnetic junctions 110 may be formed.

Using the method 500, the magnetic devices 100, 100A, 100B, 00C, 100D, 100E, 100F, 100G, and/or analogous magnetic devices may be fabricated. As a result, the benefits of the magnetic devices 100, 100A, 100B, 00C, 100D, 100E, 100F and/or 100G may be achieved.

Figure 18:
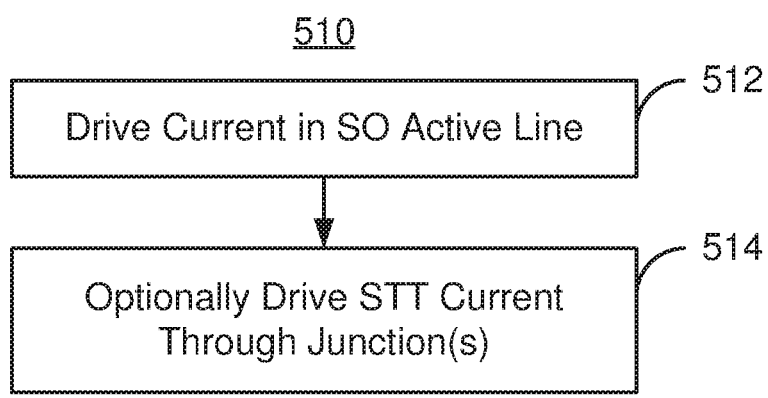
FIG. 18 is a flow chart depicting an exemplary embodiment of a method for programming a magnetic junction programmable using SO torque and including vertical magnetic junctions.

FIG. 18 depicts an exemplary embodiment of a method 510 for programming a magnetic junction using SO torque. For simplicity, some steps may be omitted, performed in another order, include substeps and/or combined. Further, the method 510 may start after other steps have been performed. For simplicity, the method 510 is described in the context of the magnetic junction 110. However, other magnetic junctions, including but not limited to the magnetic junctions 110A, 1106, 110C, 110D, 110E, 110F, 110G, 110H and/or an analogous magnetic junction may be programmed.

The desired current is driven through the SO active layer 130/line 131, via step 512. Thus, the current is driven along the axis of the SO active layer 130/lien 131 and substantially perpendicular to the sides. In embodiments, in which the current through the SO torque is sufficient to program the device as desired, then the method 510 terminates.

However, in some embodiments, multiple currents are used to program a magnetic junction. Thus, an additional STT current may be driven, via step 512. In some embodiments, the STT current is driven through the magnetic junctions to be programmed. In such embodiments, the STT current is desired to assist in programming and/or select the final state of the free layer 112. In other embodiments, the STT current may be driven through magnetic junctions whether or not they are to be programmed. In such embodiments, the direction of the STT current provided in step 514 depends upon whether the magnetic junction 110 is to be programmed. If so, the STT current is driven in a direction that adds to the SO torque. If not, the STT current is driven in a direction such that the STT torque opposes the SO torque. In some embodiments, the current through the SO active layer 130 commence at substantially the same time as the STT current. In other embodiments, the current through the SO active layer is started first, and the STT current commences later. Similarly, in some embodiments, the current through the SO active layer 130 may be terminated before the STT current goes to zero. In other embodiments, the STT current may be terminated before the current through the SO active layer 130. In still other embodiments, the current through the SO active layer 130 and the STT current through the magnetic junction may be terminated at substantially the same time. However, in most embodiments, the current through the SO active layer 130 and the STT current overlap in time.

Thus, the magnetic junctions 110, 110A, 110B, 110C, 110D, 110E, 110F, 110G, 110H, 212, 312 and/or 412 may be programmed. As a result, the benefits of the magnetic device(s) 100, 100A, 100B, 100C, 100D, 100E, 100F, 100G, 100H, 200, 200B, 200C, 300A, 300B, 400A and/or 400B may be achieved.

A method and system for providing and using a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic device comprising:
   at least one spin-orbit interaction (SO) active layer having a plurality of sides, the at least one SO active layer carrying a current in at least one direction substantially perpendicular to the plurality of sides; and
   at least one magnetic junction, each of the at least one magnetic junction being adjacent to the plurality of sides and substantially surrounding a portion of the SO active layer, each of the at least one magnetic junction including a free layer, a reference layer and a nonmagnetic spacer layer, the nonmagnetic spacer layer being between the reference layer and the free layer, the at least one SO active layer exerting a SO torque on the free layer due to the current passing through the at least one SO active layer, the free layer being switchable between a plurality of stable magnetic states.

2. The magnetic device of claim 1 wherein each of the at least one magnetic junction further includes:
   a reference layer; and
   a nonmagnetic spacer layer, the nonmagnetic spacer layer being between the reference layer and the free layer.

3. The magnetic device of claim 1 further comprising:
   a substrate, each of the at least one magnetic junction forming a nonzero angle with the substrate.

4. The magnetic device of claim 3 wherein the nonzero angle is substantially ninety degrees.

5. The magnetic device of claim 1 wherein each of the at least one magnetic junction has a substantially circular cross-section.

6. The magnetic device of claim 1 wherein the plurality of stable magnetic states of the free layer are selected from a first stable axis along the at least one direction; a second stable state parallel to the plurality of sides and a radial direction substantially perpendicular to the plurality of sides.

7. The magnetic device of claim 1 wherein the SO active layer has a first resistivity and is part of a line including a core having a second resistivity, the SO active layer substantially surrounding the core, the first resistivity being less than the second resistivity.

8. The magnetic device of claim 1 wherein the at least one magnetic junction is a single magnetic junction and wherein the magnetic device further includes:
   a selection device coupled with the at least one SO active layer.

9. The magnetic device of claim 8 wherein the selection device is selected from a planar transistor and a three-dimensional transistor.

10. The magnetic device of claim 7 further comprising:
    a diode coupled with the reference layer.

11. The magnetic device of claim 1 wherein the at least one magnetic junction is a plurality of magnetic junctions.

12. The magnetic device of claim 11 further comprising:
    at least one isolation device interleaved with the plurality of magnetic junctions.

13. A magnetic device comprising:
    a plurality of spin-orbit interaction (SO) active layers, each of the plurality of SO active layers having a plurality of sides and carrying a current in at least one direction substantially perpendicular to the plurality of sides;
    at least one magnetic junction coupled with each of the plurality of SO active layers, each of the at least one magnetic junction being adjacent to the plurality of sides and substantially surrounding a portion each of the plurality of SO active layers, each of the at least one magnetic junction including a free layer, a reference layer and a barrier layer, the barrier layer being between the reference layer and the free layer, each of the plurality of SO active layers exerting a SO torque on the free layer due to the current passing through each of the plurality of SO active layers, the free layer being switchable between a plurality of stable magnetic states, the plurality of stable magnetic states of the free layer being selected from a first stable axis along the at least one direction; a second stable state parallel to the plurality of sides and a radial direction substantially perpendicular to the plurality of sides; and
    a plurality of lines coupled with the reference layer of the at least one magnetic junction.

14. A method for writing to at least one magnetic junction of a magnetic device comprising:
    driving a spin-orbit interaction (SO) write current through at least one SO active layer having a plurality of sides, the at least one SO active layer carrying the SO write current in at least one direction substantially perpendicular to the plurality of sides, the at least one magnetic junction, each of the at least one magnetic junction being adjacent to the plurality of sides and substantially surrounding a portion of the SO active layer, each of the at least one magnetic junction including at least a free layer, a reference layer and a nonmagnetic spacer layer, the nonmagnetic spacer layer being between the reference layer and the free layer, the at least one SO active layer exerting a SO torque on the free layer due to the SO write current passing through the at least one SO active layer.

15. The method of claim 14 wherein each of the at least one magnetic junction further includes a reference layer and a nonmagnetic spacer layer, the nonmagnetic spacer layer being between the reference layer and the free layer.

16. The method of claim 15 further comprising:
driving a spin transfer torque (STT) write current through the at least one magnetic junction while the SO write current is driven through the SO active layer, a final magnetic state of the free layer being set by the STT write current.

17. The method of claim 15 further comprising:
driving a spin transfer torque (STT) write current through the at least one magnetic junction after the SO write current starts to be driven through the SO active layer.

18. The method of claim 15 further comprising:
driving a spin transfer torque (STT) write current through the at least one magnetic junction after the SO write current terminates.

* * * * *